United States Patent
Watanabe et al.

(10) Patent No.: US 6,218,281 B1
(45) Date of Patent: Apr. 17, 2001

(54) SEMICONDUCTOR DEVICE WITH FLIP CHIP BONDING PADS AND MANUFACTURE THEREOF

(75) Inventors: Eiji Watanabe; Hirohisa Matsuki, both of Kawasaki; Kenichi Kado, Kunitachi; Kenichi Nagashige, Kawasaki; Masanori Onodera, Kawasaki; Kunio Kodama, Kawasaki; Hiroyuki Yoda, Kawasaki; Joji Fujimori, Kawasaki; Minoru Nakada, Yokohama; Yutaka Makino, Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/192,443

(22) Filed: Nov. 16, 1998

(30) Foreign Application Priority Data

Dec. 26, 1997 (JP) .................................................... 9-361140

(51) Int. Cl.$^7$ ...................................................... H01L 21/44
(52) U.S. Cl. .............................................................. 438/612
(58) Field of Search ................................................ 438/612

(56) References Cited

U.S. PATENT DOCUMENTS 5,885,891 * 3/1999 Miyata et al. .
6,030,890 * 2/2000 Iwabuchi .

FOREIGN PATENT DOCUMENTS

| 63-160250 | 7/1988 | (JP) . |
| 1-135045 | 5/1989 | (JP) . |
| 6-24674 | 4/1994 | (JP) . |
| 8-236909 | 9/1996 | (JP) . |

* cited by examiner

*Primary Examiner*—Richard Booth
*Assistant Examiner*—Josetta I. Jones
(74) *Attorney, Agent, or Firm*—Armstrong Westerman Hattori McLeland & Naughton, LLP

(57) ABSTRACT

A semiconductor substrate is prepared which has a principal surface, an exposed pad made of conductive material being formed in a partial area of the principal surface, and the other area of the principal surface being covered with a first insulating film. A base conductive film is formed on the first insulating film and the pad. A photoresist film having a thickness of 50 μm or thicker is formed on the base conductive film. An opening is formed through the photoresist film in an area corresponding to the pad to expose a partial surface area of the base conductive film. A conductive bump electrode is deposited on the base conductive film exposed on a bottom of the opening. The photoresist film is removed. This method is suitable for making a fine pitch between bump electrodes.

29 Claims, 13 Drawing Sheets

SEMICONDUCTOR DEVICE WITH FLIP CHIP BONDING PADS AND MANUFACTURE THEREOF

This application is based on Japanese Patent Application No. 9-361140, filed on Dec. 26, 1997, the entire contents of which are incorporated herein by reference.

BACKGROUND OF THE INVENTION a) Field of the Invention

The present invention relates to a semiconductor device and its manufacture method, and more particularly to a semiconductor device having bump electrodes suitable for flip chip bonding and its manufacture method.

With advancement of high integration and multi-function of a semiconductor integrated circuit, the number of connection electrodes of the circuit to an external circuit is increasing. Requirements for compact devices make device assembly use flip chip bonding using bump electrodes.

b) Description of the Related Art

A conventional method of forming bump electrodes will be described with reference to FIGS. 11A and 11B.

As shown in FIG. 11A, on the surface of a semiconductor substrate 200, an insulating film 201 is formed, and a pad 202 made of aluminum (Al) is formed in a partial surface area of the insulating film 201. The other surface area of the insulating film 201 is covered with an insulating film 203. A metal film 204 is formed on the pad 202 and insulating film 203, covering the whole surface of the substrate.

A photoresist film 205 having a thickness of several microns is coated on the metal film 204. An opening 205a is formed through the photoresist film 205 in an area corresponding to the pad 202. On the surface of the metal film 204 exposed at the bottom of the opening 205a, a bump material 206 made of SnPb alloy is deposited through electrolysis plating. The bump material 206 fills the inside of the opening 205a, extends thereafter from the periphery of the opening 205a to the surface area of the photoresist film 205, and shows a mushroom shape.

The photoresist film 205 is thereafter removed and a portion of the metal film 204 not covered with the bump material 206 is etched and removed.

As shown in FIG. 11B, a reflow process is performed by heating the substrate so that the bump material of the mushroom shape changes to generally a sphere shape. In the above manner, the bump electrode 206 is formed on the pad 202.

With the conventional method described above, when the bump material is deposited through plating, the bump material 206 takes the mushroom shape expanding around the pad 202 as shown in FIG. 11. Therefore, if the pitch between pads becomes small, adjacent bump electrodes are likely to contact each other. It is difficult to arrange uniformly for the height of bump electrodes 206 having generally the sphere shape shown in FIG. 11B.

Although a method of forming a solder ball on a pad through a transfer process is known, also this method is difficult to deal with a fine pitch between pads.

SUMMARY OF THE INVENTION

It is an object of the present invention to provide a semiconductor device with bump electrodes with a fine pitch and its manufacture method.

According to one aspect of the present invention, there is provided a method of manufacturing a semiconductor device comprising the steps of: preparing a semiconductor substrate having a principal surface, an exposed pad made of conductive material being formed in a partial area of the principal surface, and the other area of the principal surface being covered with a first insulating film; forming a base conductive film on the first insulating film and the pad; forming a photoresist film on the base conductive film by coating photoresist source liquid having a viscosity of 3000 to 4000 cps on the base conductive film, the photoresist film having a thickness of 50 μm or thicker and made of material having a transmittivity of 90% or higher relative to an ultraviolet ray having a wavelength of 436 nm when the photoresist film has a thickness of 200 μm; forming an opening through the photoresist film in an area corresponding to the pad to expose a partial surface area of the base conductive film; depositing a conductive bump electrode on the base conductive film exposed on a bottom of the opening; and removing the photoresist film.

Since the photoresist film has a thickness of 50 μm, it is possible to deposit the bump electrode in the opening formed through the photoresist and form a bump electrode having a height of about 50 μm. Since the bump electrode not protruding above the opening, the bump electrodes can be formed with good reproductivity on pads disposed at a fine pitch therebetween.

According to another aspect of the present invention, there is provided a method of manufacturing a semiconductor device comprising the steps of: preparing a semiconductor substrate having a principal surface, an exposed pad made of conductive material being formed in a partial area of the principal surface, and the other area of the principal surface being covered with a first insulating film; forming a base conductive film on the first insulating film and the pad; forming a photoresist film on the base conductive film; forming an opening through the photoresist film in an area corresponding to the pad to expose a partial surface area of the base conductive film; immersing the semiconductor substrate into electrolysis plating liquid and depositing a conductive bump electrode by electrolysis-plating a surface of the base conductive film exposed on the bottom of the opening while a current density is increased more the greater a height of the deposited bump electrode becomes; and removing the photoresist film.

If the aspect ratio of the opening is high, it is difficult to transport metal ions to be plated to the bottom of the opening. It is therefore preferable to set a current density smaller and a plating speed lower. As the plating progresses and the opening becomes shallow, metal ions become easy to be transported to the bottom of the opening, so that the current density can be increased and the plating speed can be increased.

According to another aspect of the present invention, there is provided a method of manufacturing a semiconductor device comprising the steps of: preparing a semiconductor substrate having a principal surface, an exposed pad made of conductive material being formed in a partial area of the principal surface, and the other area of the principal surface being covered with a first insulating film; forming a base conductive film on the first insulating film and the pad; forming a photoresist film on the base conductive film; selectively exposing and developing the photoresist film to form an opening through the photoresist film in an area corresponding to the pad to expose a partial surface of the base conductive film, the opening forming step repetitively executing a first subsidiary step and a second subsidiary step during developing the photoresist film, the first subsidiary step developing the photoresist film by applying developing liquid to the photoresist film while the semiconductor substrate is rotated, and the second subsidiary step removing thereafter photoresist swelled by the developing liquid by rotating the semiconductor substrate at a higher speed; depositing a conductive bump electrode on the partial surface of the base conductive dump exposed on a bottom of the opening; and removing the photoresist film.

If the photoresist film is thick and the aspect ratio of an opening to be developed is high, then photoresist swelled by the developing fluid becomes likely to be left on the bottom of the opening where the development progressed. By increasing the rotation speed of the substrate after the development, left photoresist can be removed, and the development can be resumed.

According to another aspect of the present invention, there is provided a method of manufacturing a semiconductor device comprising the steps of: preparing a semiconductor substrate having a principal surface, an exposed pad made of conductive material being formed in a partial area of the principal surface, and the other area of the principal surface being covered with a first insulating film; forming a base conductive film on the first insulating film and the pad; forming a photoresist film on the base conductive film; selectively exposing and developing the photoresist film to form an opening through the photoresist film in an area corresponding to the pad to expose a partial surface of the base conductive film, the opening forming step repetitively executing a first subsidiary step and a second subsidiary step during developing the photoresist film, the first subsidiary step developing the photoresist film by applying developing liquid to the photoresist film while the semiconductor substrate is rotated, and the second subsidiary step removing thereafter photoresist swelled by the developing liquid by blowing gas toward the semiconductor substrate; depositing a conductive bump electrode on the partial surface of the base conductive dump exposed on a bottom of the opening; and removing the photoresist film.

Since gas is blown, swelled photoresist can be removed and the development can be proceeded.

According to another aspect of the present invention, there is provided a method of manufacturing a semiconductor device comprising the steps of: preparing a semiconductor substrate having a principal surface, an exposed pad made of conductive material being formed in a partial area of the principal surface, and the other area of the principal surface being covered with a first insulating film; forming a base conductive film on the first insulating film and the pad; forming a photoresist film on the base conductive film; selectively exposing and developing the photoresist film to form an opening through the photoresist film in an area corresponding to the pad to expose a partial surface of the base conductive film, the opening forming step develops the photosensitive film by immersing the semiconductor substrate into developing liquid while the developing liquid is stirred; depositing a conductive bump electrode on the partial surface of the base conductive dump exposed on a bottom of the opening; and removing the photoresist film.

Since the developing fluid is stirred, swelled photoresist can be removed and the development can be proceeded.

According to another aspect of the present invention, there is provided a method of manufacturing a semiconductor device comprising the steps of: preparing a semiconductor substrate having a principal surface, an exposed pad made of conductive material being formed in a partial area of the principal surface, and the other area of the principal surface being covered with a first insulating film; forming a base conductive film on the first insulating film and the pad; forming a first photoresist film on the base conductive film; selectively exposing and developing the first photoresist film to form a first opening through the first photoresist film in an area extending from an area corresponding to the pad to an area in the semiconductor substrate where a conductive bump electrode is to be formed; plating a conductive material on a partial surface area of the base conductive film exposed on a bottom of the first opening to form an interconnect; removing the first photoresist film and forming a second photoresist film having a thickness of 50 μm or thicker on the base conductive film and the interconnect; selectively exposing and developing the second photoresist film to form a second opening through the second photoresist film in an area where the conductive bump electrode is to be formed; depositing the conductive bump electrode on a partial surface area of the interconnect exposed on a bottom of the second opening; and removing the second photoresist film.

It is possible to lead the interconnect to the pad and form the bump electrode at the position different from the position of the pad. For example, bump electrodes for flip chip bonding can be generally uniformly distributed in a semiconductor chip having wire bonding pads.

According to another aspect of the present invention, there is provided a method of manufacturing a semiconductor device comprising the steps of: preparing a semiconductor substrate having a principal surface, an exposed pad made of conductive material being formed in a partial area of the principal surface, and the other area of the principal surface being covered with a first insulating film; forming a base conductive film on the first insulating film and the pad; forming a first photoresist film on the base conductive film; selectively exposing and developing the first photoresist film to form a first opening through the first photoresist film in an area extending from an area corresponding to the pad to an area in the semiconductor substrate where a conductive bump electrode and a probe pad are to be formed; plating a conductive material on a partial surface area of the base conductive film exposed on a bottom of the first opening to form an interconnect; removing the first photoresist film and removing a portion of the base conductive film not covered with the interconnect; forming a second insulating film on a surface of the semiconductor substrate, the second insulating film covering the interconnect and having second and third openings in an area where the conductive bump electrode and the probe pad are to be formed; depositing another base conductive film covering a surface of the second insulating film and inner surfaces of the second and third openings; forming a second photoresist film on the other base conductive film; selectively exposing and developing the second photoresist film to form a fourth opening in an area corresponding to the fourth opening; depositing the conductive bump electrode on a partial surface of the other base conductive film exposed on a bottom of the fourth opening; removing the second photoresist film; and removing a portion of the other base conductive film not covered with the conductive bump electrode to expose a partial surface area of the interconnect on a bottom of the third opening corresponding to the area where the probe pad is formed.

If the bump electrode is formed by SnPb solder and the probe is made in contact with the bump electrode, the tip of the probe becomes dirty. It is not preferable to make the probe contact the bump electrode. Since the probe pad is provided, inspection can be performed without making the probe contact the bump electrode.

According to another aspect of the present invention, there is provided a semiconductor device comprising: a semiconductor substrate having a principal surface; a pad made of conductive material and formed on a partial area of the principal surface of the semiconductor substrate; a first insulating film covering a partial area of the principal surface of the semiconductor substrate not covered with the pad; an interconnect formed on the principal surface of the semiconductor substrate and electrically connected to the pad; a bump electrode formed on a partial surface area of the interconnect different from an area where the interconnect is connected to the pad; a second insulating film formed covering the interconnect; and an opening formed through the second insulating film, a bottom of the opening exposing a partial area of a surface of the interconnect corresponding to an area where the pad and the bump electrode are not formed.

Inspection can be performed by making the probe in contact with the surface of the interconnect exposed on the bottom of the opening.

As described above, bump electrodes at a fine pitch therebetween can be formed with good productivity. By placing the bump electrode at a position different from the pad position, a wire bonding chip and a flip chip bonding can be used in common.

DETAILED DESCRIPTION OF THE PREFERRED EMBODIMENTS

With reference to FIGS. 1A to 3, a method of manufacturing a semiconductor device according to the first embodiment of the invention will be described.

Figure 1A:
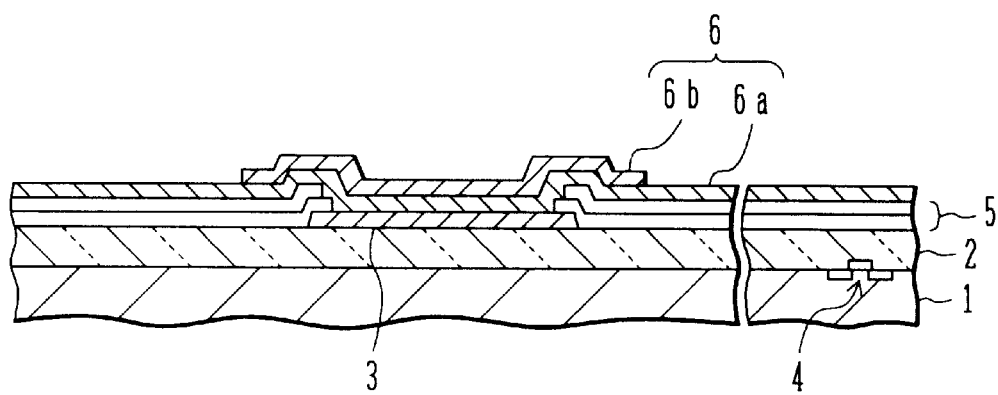
FIGS. 1A to 3 are cross sectional views of a substrate illustrating a method of manufacturing a semiconductor device according to a first embodiment of the invention.
Figure 1B:
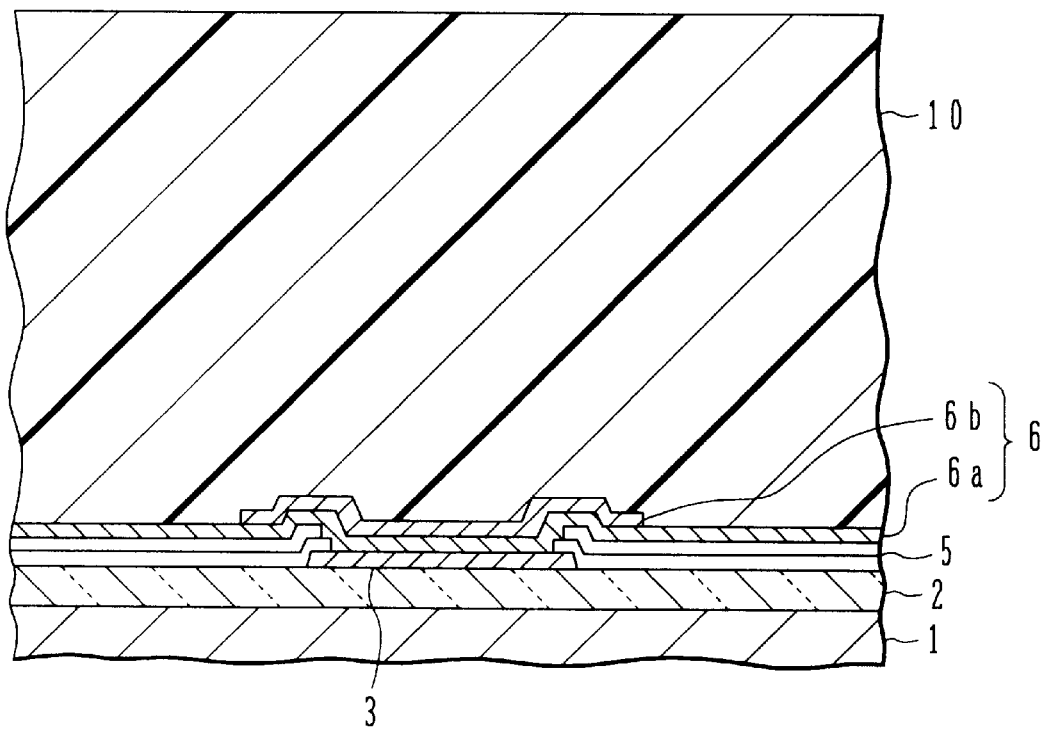

As shown in FIG. 1A, on the surface of a silicon substrate 1, an electronic circuit including a semiconductor element such as a MOS transistor 4 is formed. An insulating film 2 made of, for example, $SiO_2$, is formed covering the semiconductor element. In FIG. 1B and following drawings, the semiconductor element 4 is not shown. On a partial surface area of the insulating film 2, a pad 3 made of, for example, Al, is formed. The pad 3 is electrically connected to the electronic circuit formed in the surface layer of the silicon substrate 1. Although one pad is shown in FIG. 1A, a plurality of pads 3 are actually formed disposed at a pitch of 150 $\mu$m. The pad 3 may be made of: Al alloy containing a small amount of Ti, Cu or the like; Cu; alloy whose main composition is Cu; Au; or the like.

The partial surface area of the insulating film 2 not covered with the pad 3 is covered with a cover film 5. For example, the cover film 5 has a two-layer structure of a lower layer phosphosilicate glass (SPG) film and an upper layer polyimide film.

On the surface of the substrate prepared in the above manner, a base conductive film 6 is formed. The base conductive film 6 is constituted of a Ti film 6a having a thickness of 200 to 500 nm and covering the whole surface of the substrate and an Ni film 6b having a thickness of 200 to 500 nm and covering a partial surface area of the Ti film above the pad 3. For example, the Ti film 6a is deposited by sputtering a Ti target in an Ar atmosphere, and the Ni film is deposited by sputtering an Ni target in an Ar atmosphere. For example, the Ni film is patterned through wet etching using a diluted solution of $HNO_3$.

The base conductive film 6 functions as the cathode during an electrolysis plating process to be described later. The Ti film 6a enhances a tight contact between the underlying surface and Ni film 6b. The Ni film 6b enhances a tight contact between the Ti film 6a and the metal to be plated on the Ni film 6b.

In FIG. 1A, although the patterned Ni film 6b is shown, this Ni film may be left over the whole surface of the substrate, and the unnecessary Ni film may be removed after the electrolysis plating process. If the Ni film is patterned to leave the Ni film 6b before the electrolysis plating process as in this embodiment, it is not necessary to pattern the Ni film after the electrolysis plating process.

As shown in FIG. 1B, a photoresist film 10 having a thickness of about 150 $\mu$m is formed over the whole surface of the substrate. For example, the photoresist film 10 may be made of high polymer containing acrylic resin as its base material and multifunctional acrylate compound as crosslinking agent. The photoresist film 10 used in this embodiment has a transmittivity of about 100% relative to ultraviolet rays of a wavelength of 436 nm, when the thickness of the photoresist film 10 is set to 140 $\mu$m. A method of forming the photoresist film 10 will be described hereinunder.

Photoresist source liquid having a viscosity of 3800 cps is spin-coated on the substrate surface under the conditions of the room temperature, a rotation number of 1000 rpm, and a coating time of 10 seconds. Intermediate curing is performed at a temperature of 100° C. for 6 minutes. In this manner, a photoresist film having a thickness of 75 $\mu$m is formed. The photoresist source liquid is again spin-coated under the same conditions as above, and curing is performed at a temperature of 100° C. for 20 minutes. With this second spin-coating, the photoresist film 10 having the thickness of about 150 $\mu$m is formed.

If the viscosity of the photoresist source liquid is too low, it becomes difficult to form a thick film. Although a thick film is formed by lowering the rotation number of the substrate, it is difficult to have a uniform film thickness. Conversely, if the viscosity of the photoresist source liquid is too high, air bubbles are likely to be contained in the liquid so that use of this liquid is not convenient. From the above reasons, it is preferable to use the photoresist source liquid having a viscosity of 3000 to 4000 cps.

In order to sufficiently expose a thick photoresist film with ultraviolet rays, it is also preferable to use resist material having a transmittivity of 90% or higher relative to a wavelength of 436 nm when the thickness of a photoresist film is set to 200 μm.

Figure 2A:
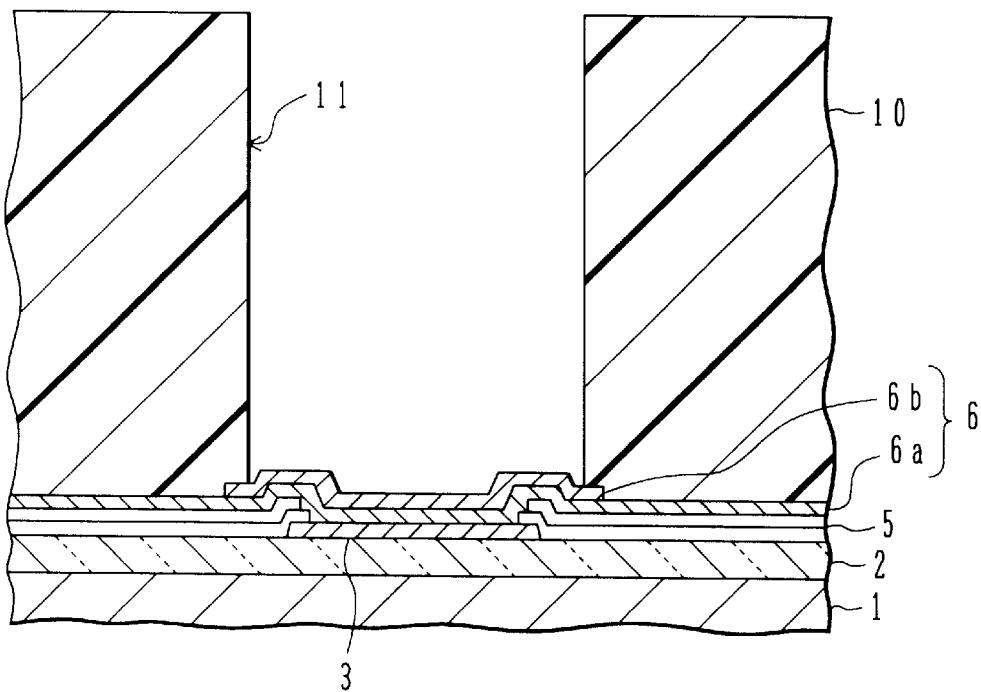

As shown in FIG. 2A, an opening 11 having a diameter of 54 μm is formed through the photoresist film 10 in an area above the pad 3. The aspect ratio of the opening 3 is therefore about 2.8. A method of forming the opening 11 will be described hereinunder.

The photoresist film 10 is selectively exposed by using ultraviolet rays having a wavelength of 436 nm. Custom developing liquid containing tetramethyle ammonium hydroxide (TMAH) heated to 30° C. in the form of mist is blown on the surface of the photoresist film 10, while the substrate is rotated with a spinner. The photoresist film 10 is therefore developed and the opening 11 can be formed. It has been confirmed that good development can be performed in the developing liquid temperature range from 23 to 70° C.

Since the photoresist film 10 is as thick as about 150 μm, photoresist swelled by the developing liquid is likely to be left in the opening and becomes difficult to be developed, as the opening becomes deeper through the development. In order to prevent the swelled photoresist from being left, it is preferable that first and second subsidiary processes are repeated, the first subsidiary process developing while the substrate is rotated at relatively low speed, and the second subsidiary process removing the swelled left photoresist by a centrifugal force while the substrate is rotated at a higher rotation number. For example, the rotation number is set to about 100 rpm during the first subsidiary process, and at 200 to 1000 rpm during the second subsidiary number.

As the opening becomes deeper, the left photoresist becomes difficult to be removed. It is therefore preferable to set the rotation number during the second subsidiary process higher than that used during the preceding second subsidiary process. In order to efficiently remove the left photoresist, it is preferable to set the rotation number during the second subsidiary process to a twofold of or higher than that of the first subsidiary process.

Instead of raising the rotation number during the second subsidiary process, the swelled photoresist may be removed by blowing gas to the substrate surface. Both raising the rotation number and blowing gas may be performed.

Instead of blowing a developing liquid in the form of mist, the substrate may be immersed into the developing liquid while it is stirred. As the developing liquid is stirred, the swelled photoresist left in the opening can be drained out of the opening.

Figure 2B:
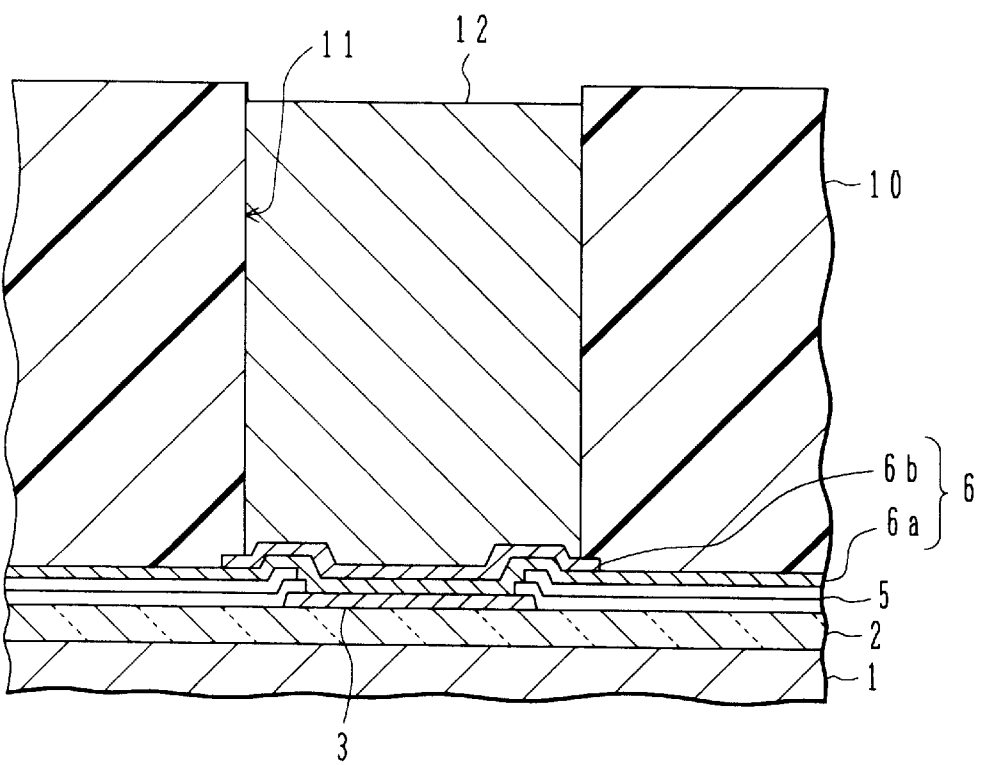

As shown in FIG. 2B, on the base conductive film 6 exposed on the bottom of the opening 11, a bump electrode material 12 made of SnPb alloy is deposited to a thickness of about 140 μm. For example, the bump electrode material 12 is deposited through electrolysis plating using SnPb eutectic plating liquid containing alkylsulfonium acid as its base material. In the electrolysis plating process, the base conductive film 6 functions as the cathode.

It is preferable to perform a process of improving the hydrophilic property of the surface of the photoresist film 10, prior to immersing the substrate into the electrolysis plating liquid. As the hydrophicil property is improved, it becomes possible to suppress air bubbles from entering the opening 11 when the substrate is immersed into the plating liquid.

For example, as the process of improving the hydrophilic property, the surface of the photoresist film 10 may be ashed in oxygen plasma, or may be immersed into organic solvent such isopropyl alcohol.

The substrate may be immersed in liquid which does not adversely affect the electrolysis plating process, and placed in a low pressure atmosphere, after the opening 11 is formed. For example, the substrate is placed in a low pressure atmosphere of 200 to 300 Torr for 2 to 3 minutes, and thereafter placed in the atmospheric atmosphere. Air bubbles left in the opening can be efficiently drained out of the opening 11 under the low pressure atmosphere. For example, the liquid which does not adversely affect the electrolysis plating process is pure water or electrolysis liquid. In order to efficiently remove air bubbles, it is preferable to set the low pressure atmosphere to 300 Torr or lower. If the inside of the opening 11 is made wet in advance, generation of air bubbles can be suppressed when the substrate is immersed in the electrolysis liquid.

The electrolysis liquid may be placed in the low pressure atmosphere during the electrolysis plating process.

If the opening 11 is deep, Pb ions and Sn ions are likely to be transported into a deep region of the opening 11. Therefore, the deep region of the opening has a high metal ion concentration and the electrolysis plating efficiency lowers. In order to recover a high metal ion concentration, a power may be stopped during every certain period, or voltages of opposite polarities may be applied intermittently at a certain interval. For example, a power is supplied for 3 to 4 minutes, and then the power is stopped for 20 seconds. A forward voltage is applied for 5 seconds, and then a reverse voltage is applied for 0.1 second.

As the deposition of the bump electrode material 12 progresses and the opening 11 becomes shallow, metal ions become easy to be transported to the plating region. From this reason, the deposition speed of the bump material 12 may be made low during the initial period of the electrolysis plating by setting the current density relatively low, and after the bump electrode material 12 is deposited to a certain degree and the opening 11 becomes shallow, the deposition speed may be made high by setting the current density high. For example, the current density during the initial period of the electrolysis plating is set to 2 A/dm$^2$, and thereafter the current density is gradually increased ultimately to 8 A/dm$^2$.

During the electrolysis plating, hydrogen gas is generated on the surface of the cathode. Hydrogen gas bubble can be prevented from becoming resident by stopping the power supply during every certain period or by intermittently applying voltages of opposite polarities, respectively during the electrolysis plating.

In this embodiment, although the aspect ratio of the opening 11 is set to about 2.8, it may be set larger. However, in order to fill the opening 11 with the bump electrode material 12 with good reproductivity, the aspect ratio of the opening 11 is preferably set to 5 or smaller.

After the bump electrode material 12 is deposited, the substrate is immersed into resist peeling liquid at a temperature of 80° C. and the photoresist film 10 is removed by bubbling the peeling liquid with nitrogen gas. The temperature of the resist peeling liquid may be in a range from the room temperature to 120° C. The resist removing liquid may be stirred to facilitate the removal of the thick photoresist film 10.

After the photoresist film 10 is removed, the portion of the base conductive film 6 not covered with the bump electrode is removed. For example, the Ti film 6a is etched by using a mixture liquid of hydrogen peroxide and ammonium hydroxide. The Ni film 6b is not necessary to be etched at this stage because it was already patterned.

Thereafter, the substrate 1 is cut into chips. Flux is coated on the chip surface, and the chip is heated to a temperature of about 250° C. to reflow the bump electrode 12.

Figure 3:
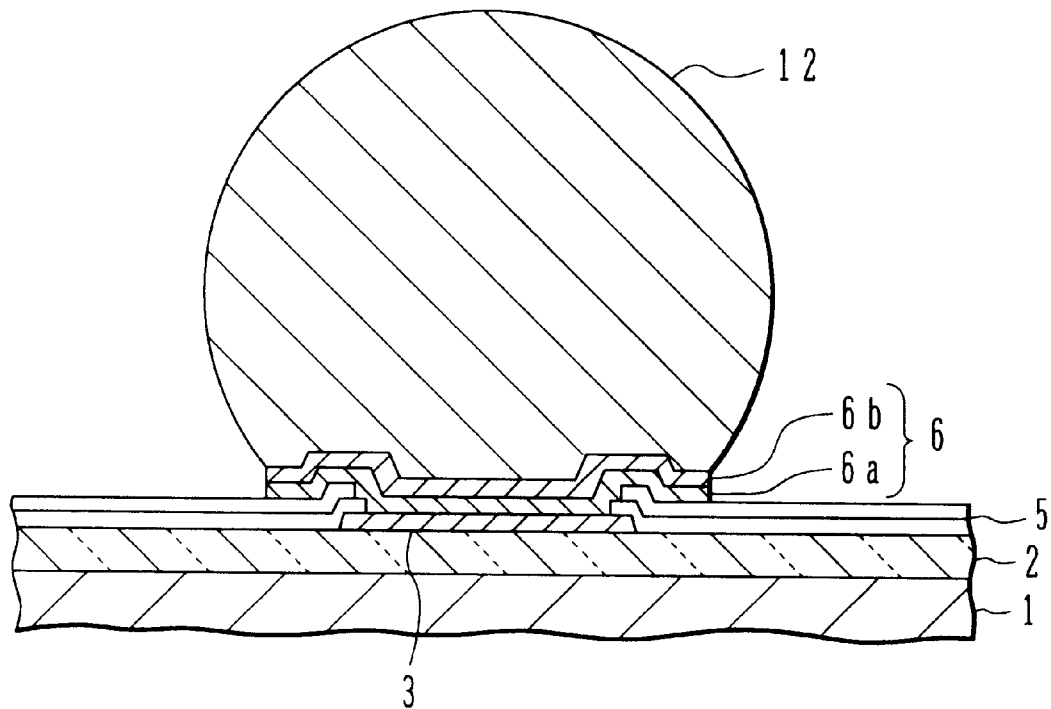

FIG. 3 is a cross sectional view of the chip after the reflow process. The bump electrode 12 of generally a sphere shape having a height of about 70 μm was formed.

In the first embodiment, as shown in FIG. 2B, the deposited bump electrode material 12 is filled in the opening 11 and does not protrude over the top of the opening. Therefore, even if the pitch of pads 3 is narrow, it is possible to prevent adjacent bump electrodes from contacting each other.

In the first embodiment, the thickness of the photoresist film 10 shown in FIG. 2B is set to 150 μm. The thickness of the photoresist film 10 is determined from a necessary volume of the bump electrode, the pitch between pads 3, and the like. In order to deposit a sufficient amount (volume) of the bump electrode material 12, it is preferable to set the thickness of the photoresist film 10 to 50 μm or more.

In the first embodiment, the bump electrode is made of SnPb alloy. For example, Sn, Pb, alloy containing Sn as its main composition may be used, or Au, Pd, Ni, or Cu having a melting point higher than Sn, Pb, and Sn alloy may also be used. If refractory metal is used, the bump electrode of generally a cylinder shape can be obtained without the reflow process described with FIG. 3. Films of the above-described metals may be laminated.

Figure 4A:
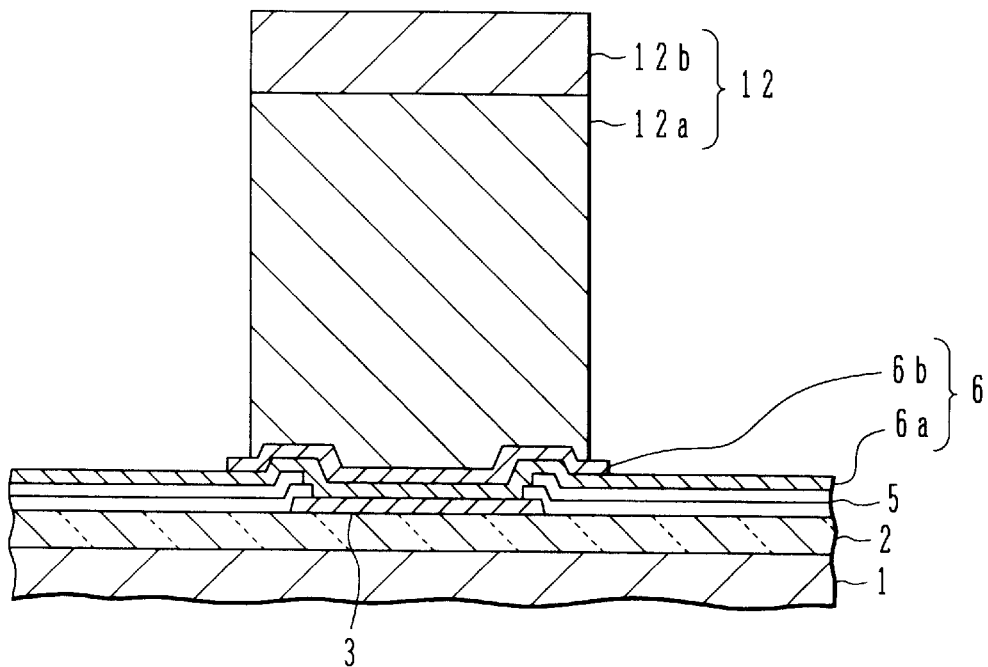
FIGS. 4A and 4B are cross sectional views of a semiconductor device according to a modification of the first embodiment.

FIG. 4A shows the structure of a bump electrode 12 having a bump lower electrode 12a made of Ni or Cu and a bump upper electrode 12b made of Au or Pd. Since the bump upper electrode 12b of the bump electrode 12d is made of the metal more difficult to be oxidized than the bump lower electrode 12a, it is possible to suppress defective contacts during flip chip bonding.

Figure 4B:
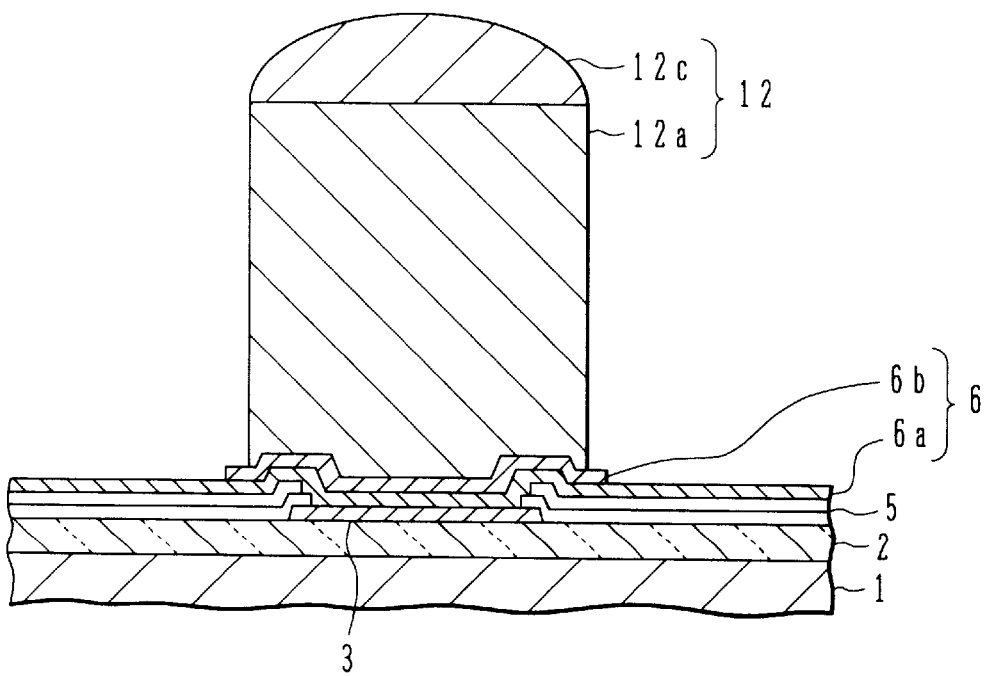

FIG. 4B shows the structure of a bump electrode 12 having a bump lower electrode 12a made of metal having a high melting point such as Au, Pd, Ni, and Cu and a bump upper electrode 12c made of Sn, Pb, SnPb alloy, and alloy having Sn as its main composition. Only the bump upper electrode 12c is reflowed to form a convex surface.

Only the tip portion of the bump electrode 12 extends laterally during flip chip bonding. As compared with the bump electrode of generally the sphere shape shown in FIG. 3, the amount of lateral extension can be made small.

In the first embodiment, the bump electrode material is deposited by electrolysis plating. The bump electrode may be deposited by other methods. For example, Ni, Cu or the like may be deposited by electroless plating.

Next, with reference to FIG. 5, a method of manufacturing a semiconductor device according to a modification of the first embodiment will be described.

Figure 5:
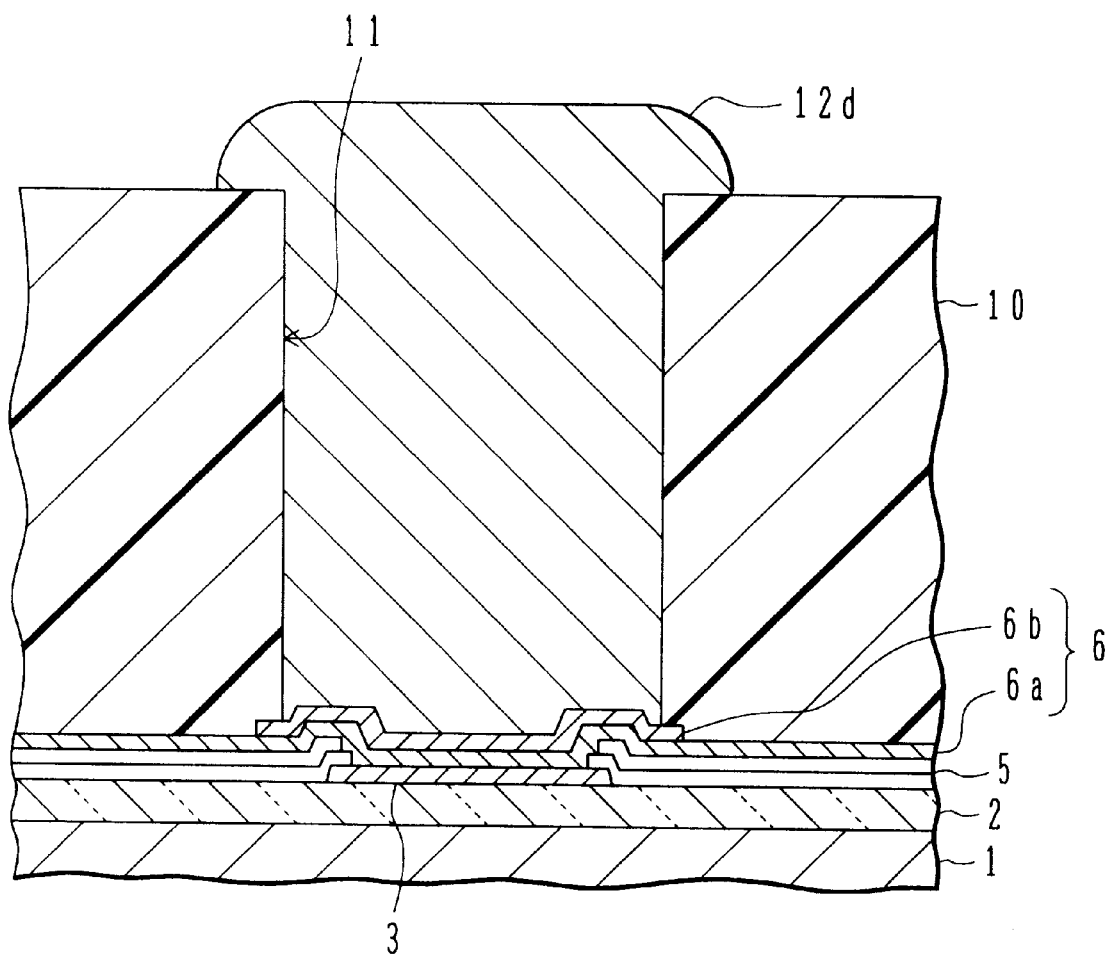
FIG. 5 is a cross sectional view of a substrate illustrating a method of manufacturing a semiconductor device according to a modification of the first embodiment.

FIG. 5 is a cross sectional view corresponding to the state shown in FIG. 2B of the first embodiment. In the embodiment shown in FIG. 2B, the thickness of the bump electrode material 12 is thinner than the photoresist film 10, and the upper surface of the bump electrode material 12 is lower than the upper surface of the photoresist film 10. In FIG. 5, a bump electrode material 12d protrudes above the upper surface of a photoresist film 10. Since the upper surface of the bump electrode material 12d protrudes above the upper surface of the photoresist film 10, the bump electrode material 12d having a larger volume can be deposited above one pad 3 without making the aspect ratio of an opening large.

It is preferable to set the protrusion height of the bump electrode 12d lower than the thickness of the photoresist film 10, in order to avoid a contact between adjacent bump electrode materials.

Next, with reference to FIG. 6 and FIGS. 7A to 7D, a semiconductor device manufacture method of the second embodiment will be described.

Figure 6:
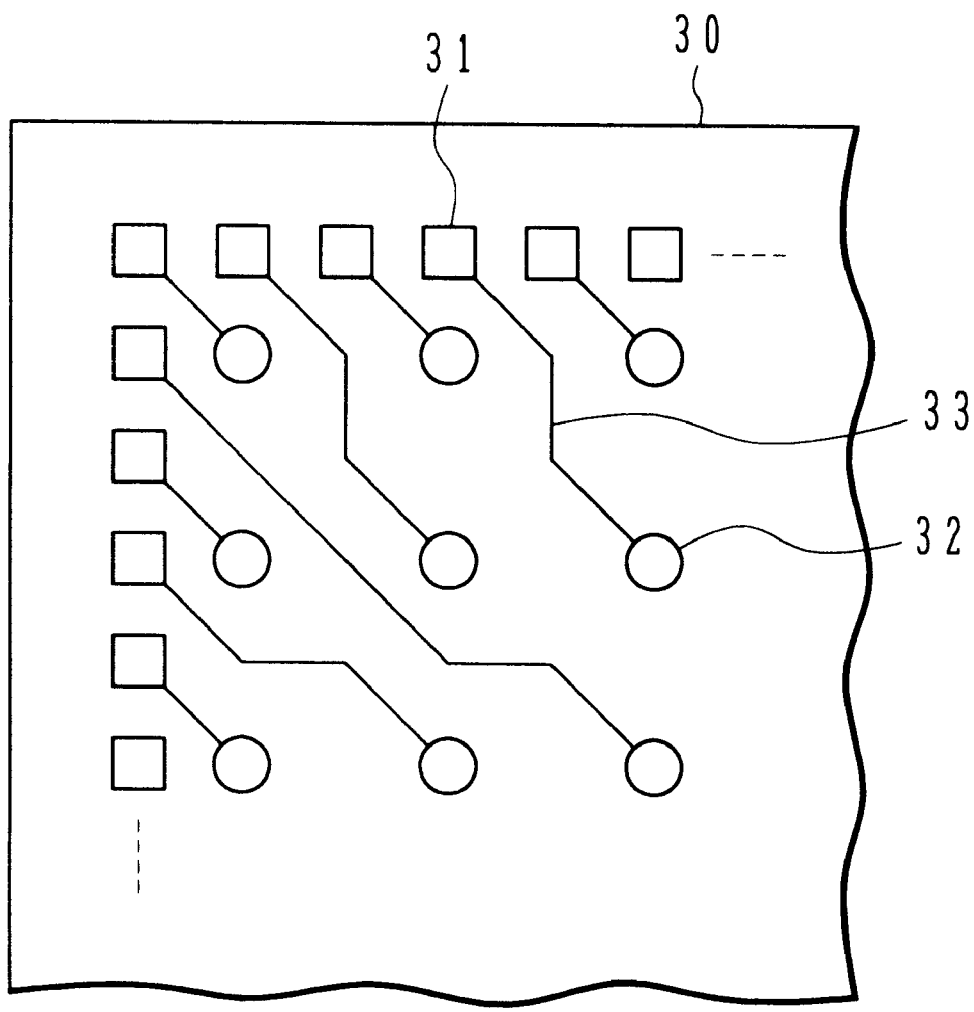
FIG. 6 is a schematic plan view showing the layout of pads and bump electrodes of a semiconductor chip manufactured by a method of manufacturing a semiconductor device according to a second embodiment.

FIG. 6 is a schematic plan view of a semiconductor chip manufactured by the second embodiment. A plurality of pads 31 are disposed in a peripheral area of the semiconductor chip 30. Each pad 31 is used for the assembly of the chip through wire bonding. Bump electrodes 32 are generally uniformly distributed in the chip. Each bump electrode 32 is electrically connected to a corresponding pad 31 by an interconnect 33.

With the method of the first embodiment, the bump electrode is formed at the position where a pad 31 is formed. If the pads 31 are generally uniformly distributed in the chip, the bump electrodes are also uniformly distributed in the chip. However, if the wire bonding chip such as shown in FIG. 6 is used for flip chip bonding, the bump electrodes are disposed only in the peripheral area of the chip.

If the wire bonding is performed only in the chip peripheral area, stress is concentrated upon the chip peripheral area, which may lower the reliability. As shown in FIG. 6, since the bump electrodes 32 are generally uniformly distributed in the chip, concentration of stress can be alleviated and the reliability can be improved.

Next, with reference to FIGS. 7A to 7D, the semiconductor device manufacture method of the second embodiment will be described.

Figure 7A:
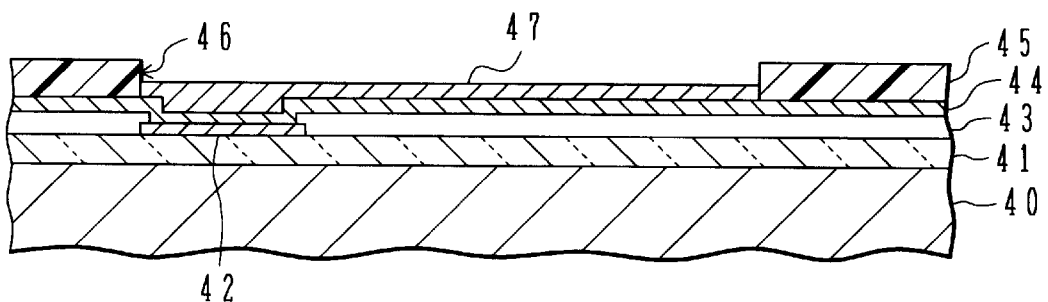
FIGS. 7A to 7D are cross sectional views of a substrate illustrating the semiconductor device manufacturing method of the second embodiment.

As shown in FIG. 7A, a silicon substrate 40 has an insulating film 41 formed on the surface thereof, the insulating film being made of, for example, $SiO_2$. The surface layer of the silicon substrate 40 has a semiconductor element formed therein, similar to the MOS transistor 4 shown in FIG. 1A. A partial surface area of the insulating film 41 has a pad 42 formed thereon, the pad being made of, for example, Al. The pad 42 is electrically connected to the semiconductor element formed in the surface layer of the silicon substrate. In FIG. 7A, although a single pad is shown, a plurality of pads are actually disposed in the peripheral area of the semiconductor chip at a pitch of 150 μm, such as shown in FIG. 6.

A cover film 43 covers a partial surface area of the insulating film 41 not covered with the pad 42. For example, the cover film 43 has a two-layer structure of a phosphosilicate glass (PSG) lower layer and a polyimide upper layer.

On the surface of the substrate described above, a base conductive film 44 is formed. The base conductive film 6 has a two-layer structure of a Cr film having a thickness of 150 nm and a Cu film having a thickness of 1000 nm and formed on the Cr film. For example, the Cr film and Cu film is deposited by sputtering a Cr target and Cu target, respectively, in an Ar atmosphere.

The base conductive film 44 functions as the cathode during an electrolysis plating process to be described later. The Cr film 6a enhances a tight contact between the underlying surface and Cu film. The Cu film enhances a tight contact between the Cr film and the metal to be plated on the Cu film.

A photoresist film 45 having a thickness of about 5 μm is formed on the base conductive film 44. An opening 46 is formed through the photoresist film 45 in the area from an area under which the pad 42 is disposed to an area where a corresponding bump electrode is formed. A partial surface area of the base conductive film 44 is exposed on the bottom of the opening 46.

On the base conductive film 44 exposed on the bottom of the opening 46, an interconnect 47 made of Cu and having a thickness of about 4 µm is deposited by electrolysis plating. After the interconnect 47 is deposited, the photoresist film 45 is removed.

Figure 7B:
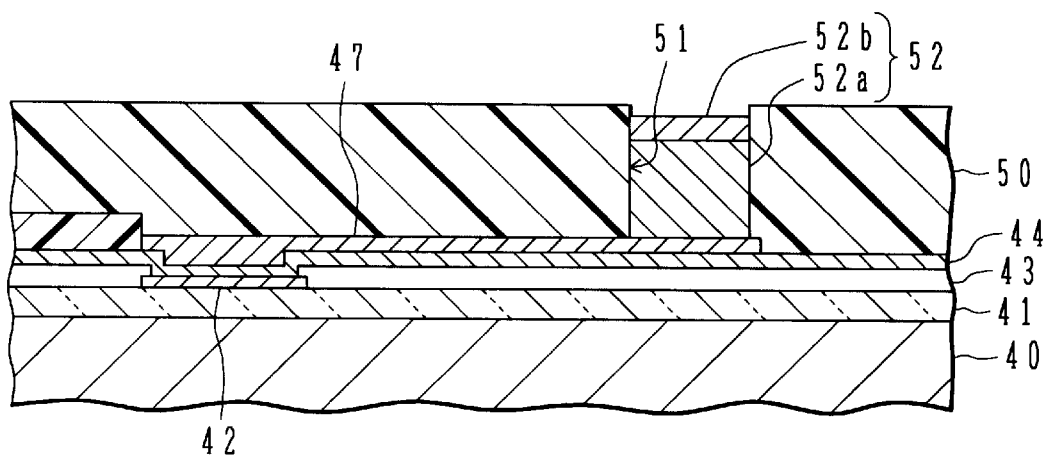

As shown in FIG. 7B, a photoresist film 50 having a thickness of 110 µm is formed over the whole surface of the substrate. The photoresist film 50 is formed by the same method as used for the photoresist film 10 shown in FIG. 1B. An opening is formed through the photoresist film 50 in an area where the bump electrode is formed. A partial surface area of the interconnect 47 is exposed on the bottom of the opening 51. The opening 51 is formed by the same method as used for the opening 11 shown in FIG. 2A.

On the interconnect 47 exposed on the bottom of the opening 51, a bump lower part 52a made of 90 µm Cu and a bump upper part 52b made of 10 µm thick Pd are deposited by electrolysis plating. A bump electrode 52 having a two-layer structure is therefore formed. The electrolysis plating is performed by the same method as used for the deposition of the electrode material 12 shown in FIG. 2B.

Figure 7C:
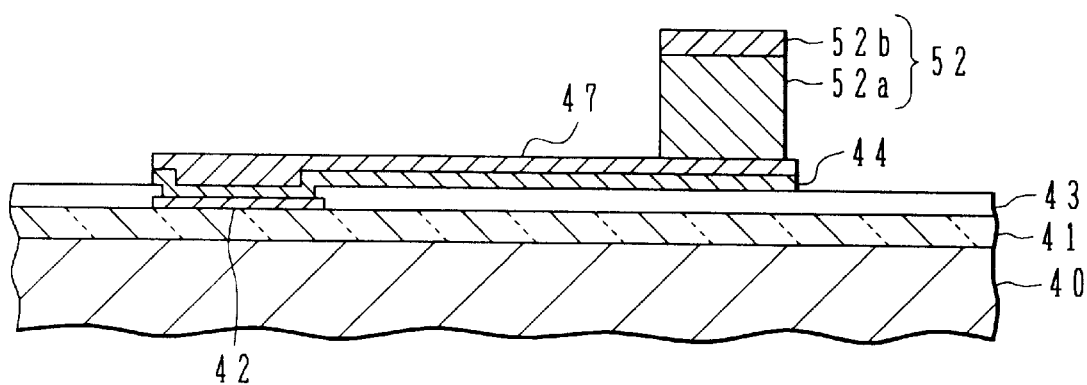

As shown in FIG. 7C, the photoresist film 50 is removed. The photoresist film 50 is removed by the same method as used for the removal of the photoresist film 10 shown in FIG. 2B. A portion of the base conductive film 44 not covered with the interconnect 47 is etched. For example, a mixture liquid of acetic acid and hydrogen peroxide is used as etchant for the upper Cu film, and diluted hydrochloric acid is used as etchant for the lower Cr film. While the upper Cu film of the base conductive film 44 is etched, the surface layers of the interconnect 47 and bump lower part 52a are also etched slightly. However, this etching poses no practical problem because the interconnect 47 and bump upper part 52b are sufficiently thicker than that of the base conductive film 44. The base conductive film 44 is therefore patterned to have the same shape as the interconnect 47.

Figure 7D:
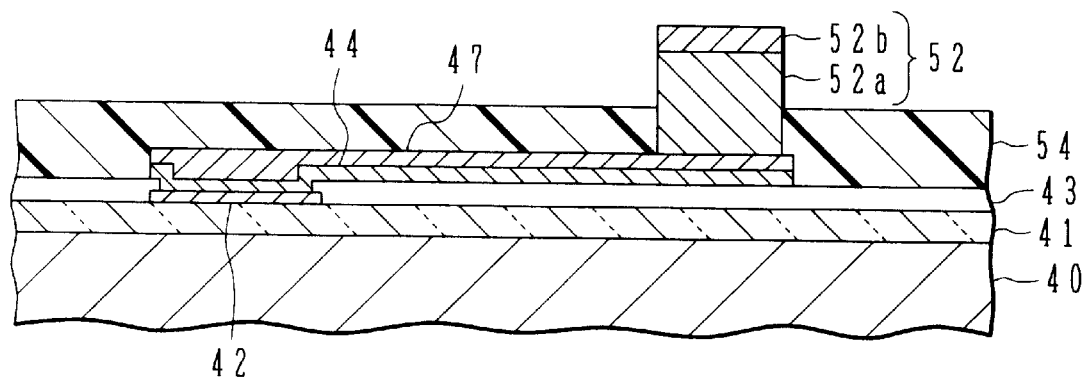

As shown in FIG. 7D, an insulating film 54 is formed on the substrate through printing, by masking the area where the bump electrode 52 was formed. The material of the insulating film 54 is epoxy, for example. In the above manner, the bump electrode connected to the pad 42 can be formed at the position different from the pad 42.

In the structure of the second embodiment, the bump electrode 52 is surrounded and supported by the insulating film 54. After a semiconductor chip is mounted on an assembly substrate, the base conductive film 44 may be peeled away from the cover film 43 in an area where the bump electrode 52 is positioned, by the stress generated by a thermal expansion difference between the semiconductor chip and assembly substrate. This peel can be suppressed because the bump electrode 52 is surrounded and supported by the insulating film 54.

In the second embodiment, the photoresist film 50 shown in FIG. 7B is 110 µm in thickness. Other thicknesses may be set. However, in order to make the bump electrode 50 have a sufficient height, it is preferable to set the thickness of the photoresist film 50 to 50 µm or more.

If the upper surface of the bump electrode 52 is higher than that of the photoresist film 50, the upper portion of the bump electrode 52 has a laterally extended shape. This lateral extension can be avoided by depositing the bump electrode 52 lower than the upper surface of the photoresist film 50.

The bump electrode 52 may be constituted of a bump lower part made of metal having a relatively high melting point and a bump upper part made of metal having a relatively low melting point, similar to the case shown in FIG. 4B.

In the second embodiment, although the base conductive film 44 has the two-layer structure of the Cr and Cu films, other layer structures may be used. For example, a three-layer structure may be adopted having a lowest layer made of Cr, Ti, Mo, or alloy thereof, an intermediate layer made of Cu, Al, Ag, alloy thereof, or CrCu alloy, and a highest layer made of Cr, Pd, NI, Au, or alloy thereof. The lowest layer enhances a tight contact between the underlying layer surface and intermediate layer. The highest layer provides the intermediate layer with an oxidation preventing function. If Ag is used for the intermediate layer, the material of the highest layer is Pd, Ni, or Au. In this case, the highest layer has a function of enhancing the tight contact with the bump electrode.

A pair of electrodes was contacted to the surface of the base conductive layer 44 used by the second embodiment at a space of about 100 mm, and a spreading resistance was measured. The measured value was about 0.5 Ω. If the spreading resistance becomes large, the heights of the bump electrodes 52 deposited by the electrolysis process shown in FIG. 7B do not become uniform in the area of a wafer. In order to make uniform the heights of the bump electrodes 52, it is preferable to set the spreading resistance of the base conductive film 44 to 0.5 Ω or lower.

In the second embodiment, the bump electrode 52 has the two-layer structure of the Cu bump lower part 52a and Pd bump upper part 52b. A three-layer structure may be adopted. For example, a bump intermediate part made of material having a higher solder diffusion barrier performance than the bump upper part 52b, may be inserted between the bump lower part 52a and bump upper part 52b.

Figure 8A:
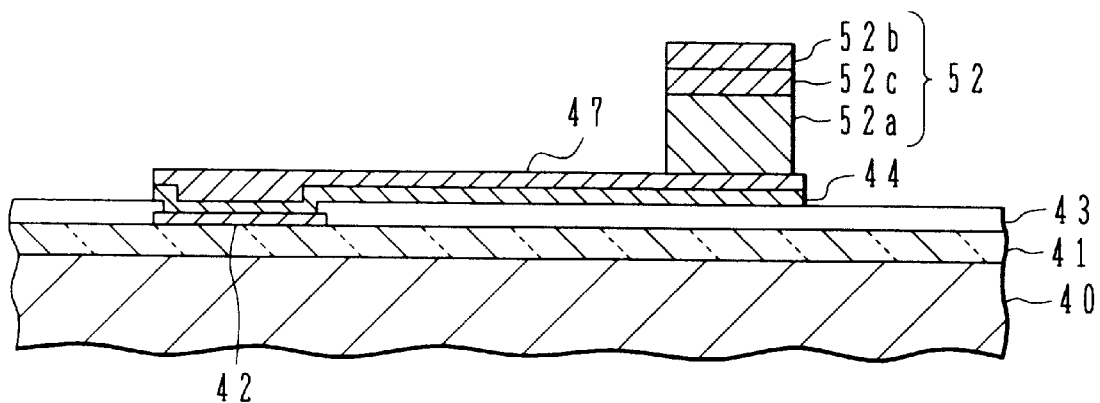
FIGS. 8A and 8B are cross sectional views showing a semiconductor device according to a modification of the second embodiment.

FIG. 8A is a cross sectional view of a substrate showing an inserted bump intermediate part 52c. For example, the bump intermediate part 52c is made of an Ni film having a thickness of 1 to 3 µm, and a bump upper part 52b is made of a Pd film having a thickness of 0.1 to 0.7 µm. The bump intermediate part 52c and bump upper part 52b are formed by depositing an Ni film and a Pd film through electrolysis plating after the bump lower part 52a is formed, in the process of the second embodiment shown in FIG. 7B.

The bump intermediate part 52c made of Ni functions as a diffusion barrier layer relative to solder connected to the bump electrode 52. The bump upper part made of Pd is difficult to be oxidized so that it provides solder with high wettability. It is therefore possible to suppress the generation of voids in solder when the chip is mounted on an assembly substrate and the bump electrode is connected by solder, so that the connection strength and reliability can be improved.

In the second embodiment, although the insulating film 54 shown in FIG. 7D is formed by printing, it may be formed by other methods.

Figure 8B:
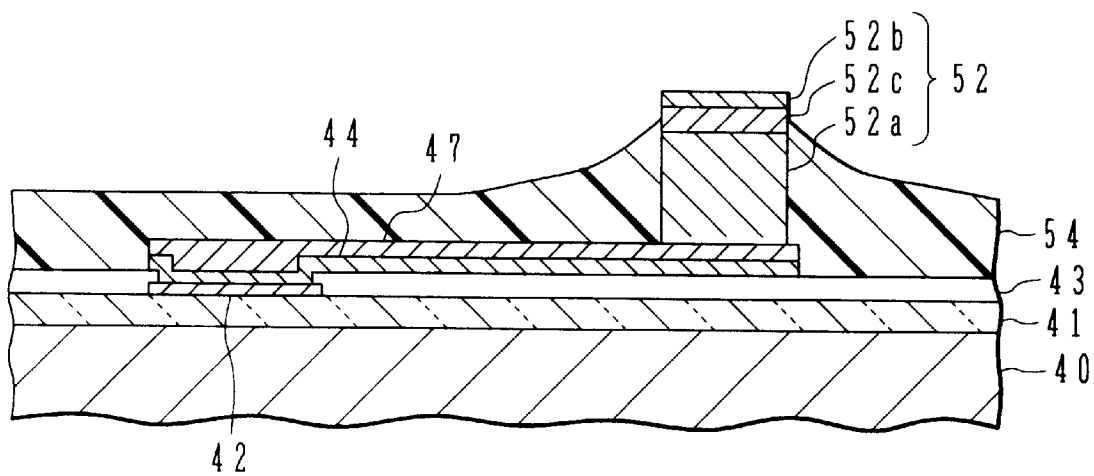

FIG. 8B shows an insulating film 54 formed by spin coating. Organic insulating material is spin-coated over the whole surface of the substrate, and dried through baking. Thereafter, unnecessary insulating material on the bump electrode 52 is removed to form the finished insulating film 54.

In this case, the insulating film 54 covers most of the surface of the bump electrode 52, excepting the head portion thereof. The bump electrode 52 can therefore be supported more strongly.

Next, the semiconductor device manufacture method according to the third embodiment will be described with reference to FIGS. 9A to 9D. The processes up to the process of depositing the interconnect 47 shown in FIG. 7A are the same as the second embodiment. After the interconnect 47 is deposited, the photoresist film 45 is removed.

Figure 9A:
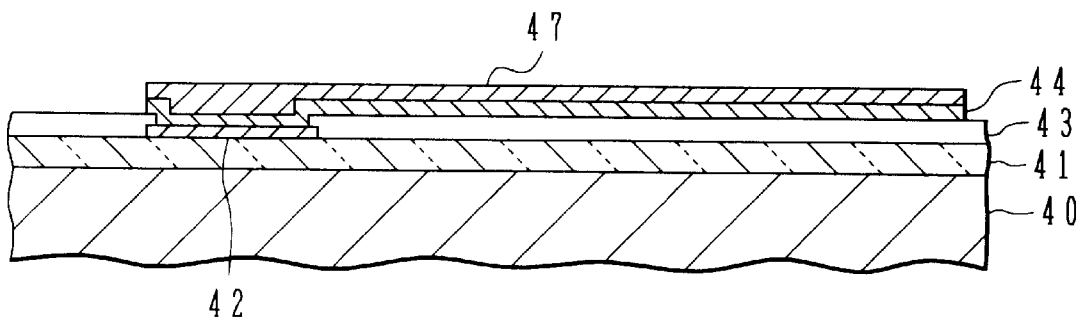
FIGS. 9A to 9D are cross sectional views of a substrate illustrating a method of manufacturing a semiconductor device according to a third embodiment of the invention.

As shown in FIG. 9A, a portion of the base conductive film 44 having a lamination structure of Cr/Cu, not covered with the interconnect 47 is removed. The etchant used is the same as that used when the base conductive film 44 is etched during the process shown in FIG. 7C. The base conductive film 44 is therefore patterned to have the same shape as the interconnect 47.

Figure 9B:
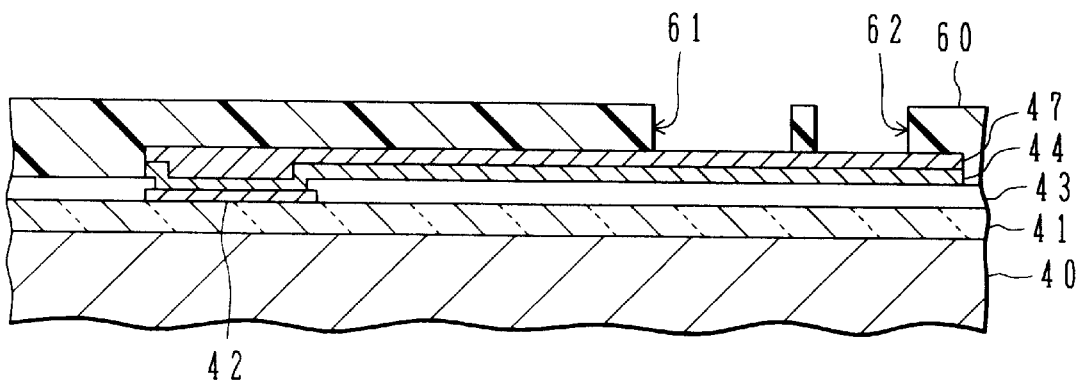

As shown in FIG. 9B, an insulating film 60 of polyimide is deposited to a thickness of about 5 µm, covering the interconnect 47. Openings 61 and 62 are formed through the insulating film 60, partially exposing the surface of the interconnect 47. A bump electrode is formed later in the opening, and a probe pad is later disposed in the area of the opening 62.

If the insulating film 60 made of photosensitive polyimide is used, the openings 61 and 62 can be formed by directly exposing and developing the insulating film 60. If the insulating film 60 made of alkali soluble polyimide is used, a photoresist film is coated on the insulating film 60, and after exposure and development of this photoresist film, the insulating film 60 is etched by using the same development liquid to form the openings 61 and 62.

Figure 9C:
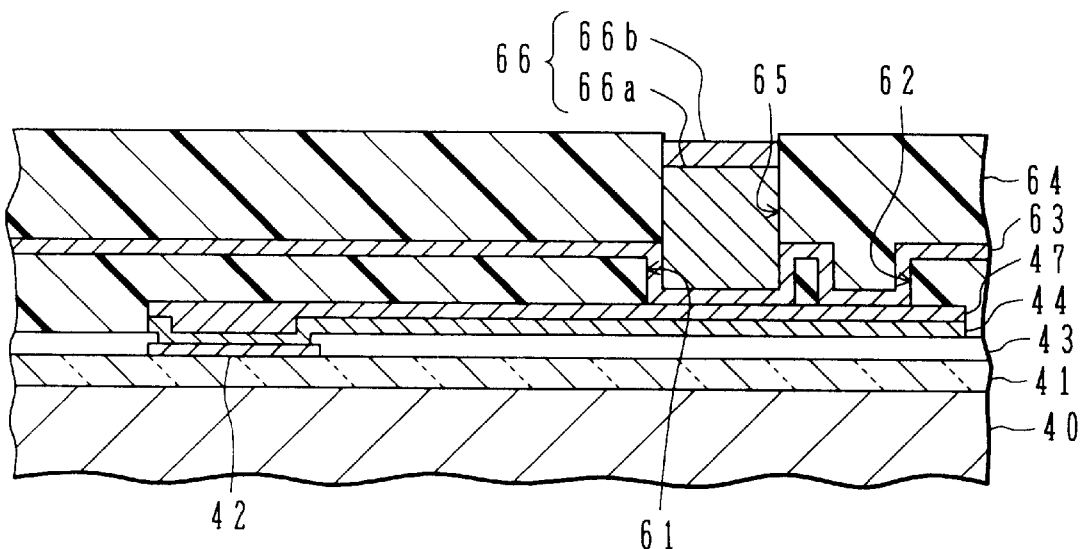

As shown in FIG. 9C, a second base conductive film 63 is formed covering the surface of the insulating film 60 and the inner surfaces of the openings 61 and 62. The second base conductive film 63 has a two-layer structure of a lower 150 nm thick Cr film and an upper 1000 nm thick Cu film. A photoresist film 64 is formed on the second base conductive film 63, and an opening 65 is formed through the photoresist film 64 in an area corresponding to the opening 61. A bump electrode 66 is deposited through electrolysis plating by using the second base conductive film 63 as the cathode. The bump electrode 66 has a two-layer structure of a Cu bump lower part 66a and a Pd bump upper part 66b.

The formation of the photoresist film 6 and opening 65 and the deposition of the bump electrode 66 are performed by the same methods as used for the formation of the photoresist film 50 and opening 51 and the deposition of the bump electrode 52 shown in FIG. 7B.

Figure 9D:
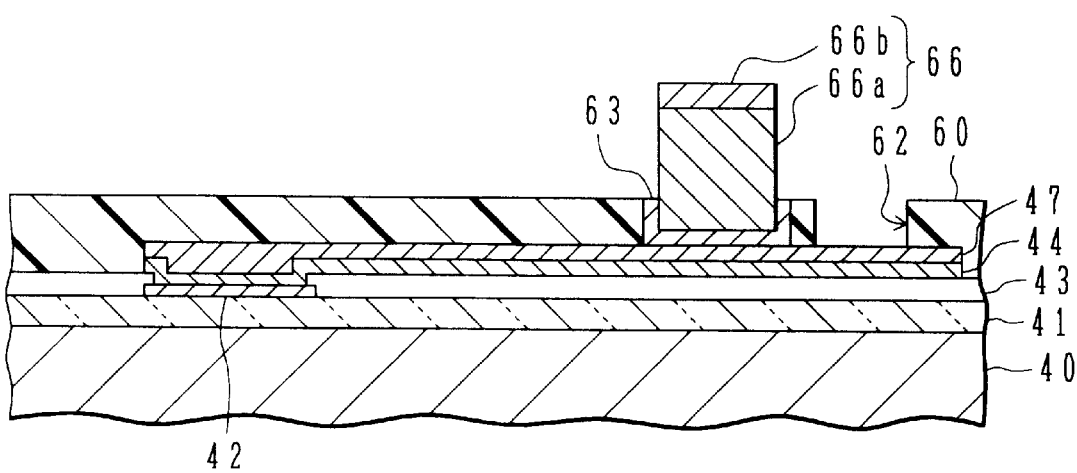

As shown in FIG. 9D, the photoresist film 64 is removed, and a portion of the second base conductive film 63 not covered with the bump electrode is removed. A partial surface area of the interconnect 47 is exposed on the bottom of the opening 62.

Different points of the semiconductor device shown in FIG. 9D from that shown in FIG. 7D reside in that the second base conductive film 63 is inserted at the interface between the bump electrode 66 and insulating film 60 and that a partial surface area of the interconnect 47 is exposed in the opening 62. By inserting the second base conductive film 63 at the interface between the bump electrode 66 and insulating film 60, a tight contact between the latter two can be enhanced and the bump electrode 66 can be supported more strongly. Further, the surface of the interconnect 47 exposed on the bottom of the opening 62 can be used as a probe pad for inspection.

Figure 10:
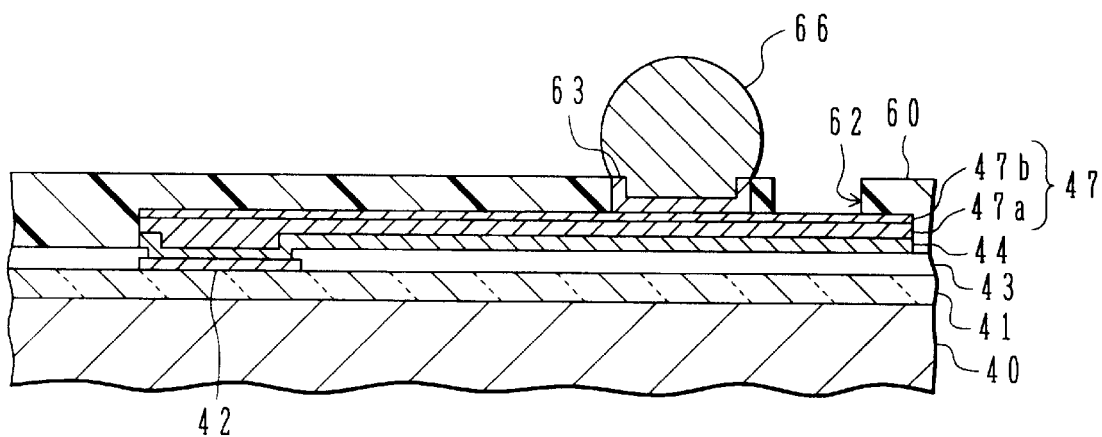
FIG. 10 is a cross sectional view showing a semiconductor device according to a modification of the third embodiment.
Figure 11A:
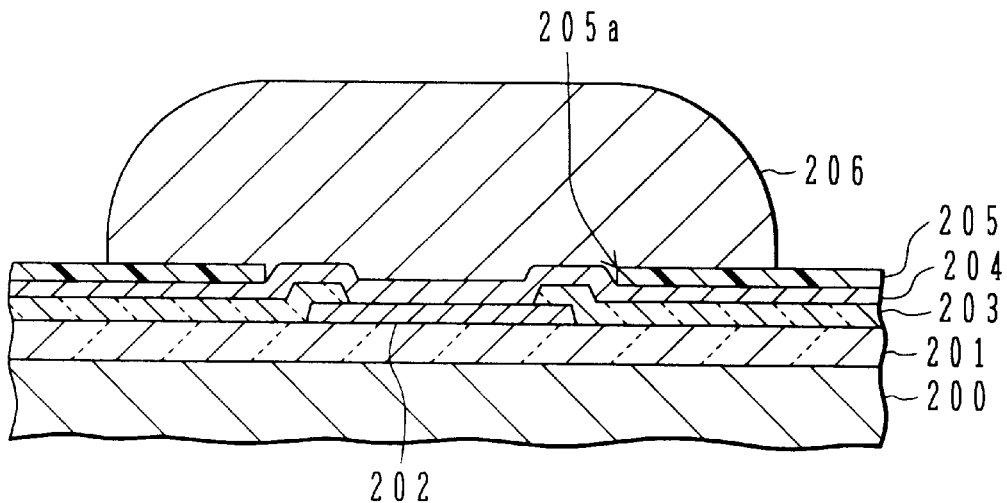
FIGS. 11A and 11B are cross sectional views of a conventional semiconductor device.
Figure 11B:
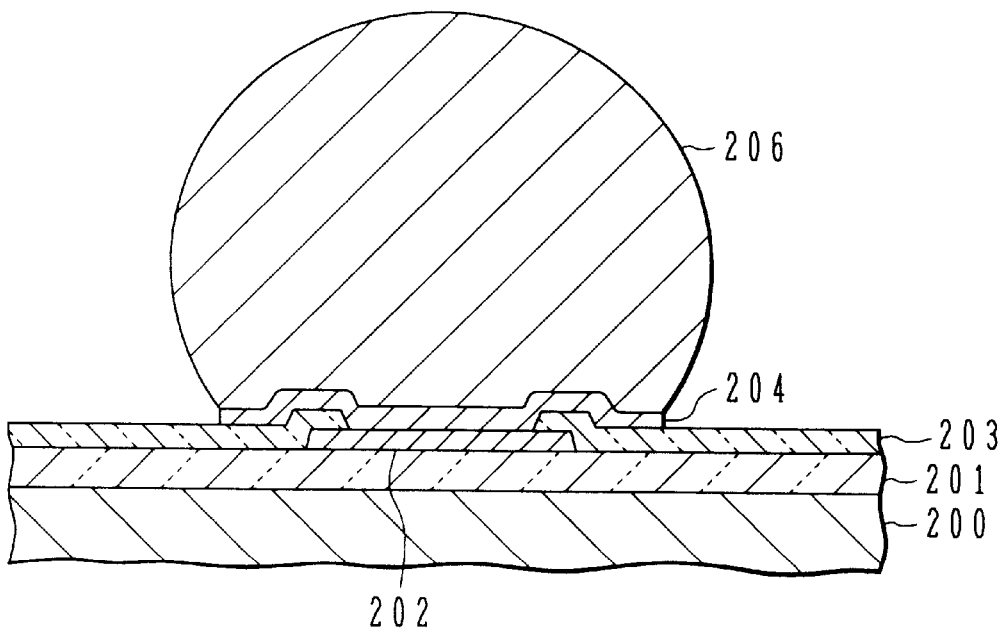

FIG. 10 is a cross sectional view of a semiconductor device according to a modification of the third embodiment. Difference points of this semiconductor device from that shown in FIG. 9D are the two-layer structure of the interconnect 47 made of a lower interconnect 47a and an upper interconnect 47b and generally a sphere shape of the bump electrode 66. For example, the lower interconnect 47a is made of Cu, and the upper interconnect 47b is made of Pd, Ni, Au or the like. The bump electrode 66 is made of SnPb alloy, for example.

If the interconnect 47 is made of a single layer of a Cu film, SnPb alloy may invade at the interface between the interconnect 47 and insulating film 64 when the bump electrode 66 is reflowed. Invasion of SnPb alloy can be prevented by using Pd, Ni or Au as the material of the upper layer of the interconnect 47.

As a probe for inspection is made in contact with the bump electrode 66 made of SnPb alloy, the tip of the probe becomes dirty after a plurality of inspections. The dirty tip of the probe can be avoided by making the probe in contact with the interconnect 47 exposed on the bottom of the opening 62.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device comprising the steps of:

preparing a semiconductor substrate having a principal surface, an exposed pad made of conductive material being formed in a partial area of the principal surface, and the other area of the principal surface being covered with the first insulating film;

forming a base conductive film on the first insulating film and the pad;

forming a photoresist film on the base conducive film by coating photoresist source liquid having a viscosity of 3000 to 4000 cps on the base conductive film, the photoresist film having a thickness of 50 µm or thicker and made of material having a transitivity of 90% or higher relative to an ultraviolet ray having a wavelength of 436 nm when the photoresist film has a thickness of 200 µm;

forming an opening through the photoresist film in an area corresponding to the pad to expose a partial surface area of the base conductive film;

depositing a conductive bump electrode on the base conductive film exposed on a bottom of the opening; and removing the photoresist film, wherein said bump electrode depositing step deposits the bump electrode so that an upper surface of the bump electrode is lower than an upper surface of the photoresist film.

2. A method of manufacturing a semiconductor device comprising the steps of:

preparing a semiconductor substrate having a principal surface, an exposed pad made of conductive material being formed in a partial area of the principal surface, and the other area of the principal surface being covered with the first insulating film;

forming a base conductive film on the first insulating film and the pad;

forming a photoresist film on the base conducive film by coating photoresist source liquid having a viscosity of 3000 to 4000 cps on the base conductive film, the photoresist film having a thickness of 50 µm or thicker and made of material having a transitivity of 90% or higher relative to an ultraviolet ray having a wavelength of 436 nm when the photoresist film has a thickness of 200 μm;

forming an opening through the photoresist film in an area corresponding to the pad to expose a partial surface area of the base conductive film;

depositing a conductive bump electrode on the base conductive film exposed on a bottom of the opening; and removing the photoresist film, wherein said bump electrode depositing step deposits the bump electrode so that the bump electrode protrudes above an upper surface of the photoresist film and a protrusion height is less than the thickness of the photoresist film.

3. A method of manufacturing a semiconductor device according to claim 2, further comprising a step of heating and melting the bump electrode to make the bump electrode have generally a sphere shape, after said photoresist film removing step.

4. A method of manufacturing a semiconductor device comprising the steps of:

preparing a semiconductor substrate having a principal surface, an exposed pad made of conductive material being formed in a partial area of the principal surface, and the other area of the principal surface being covered with the first insulating film;

forming a base conductive film on the first insulating film and the pad;

forming a photoresist film on the base conducive film by coating photoresist source liquid having a viscosity of 3000 to 4000 cps on the base conductive film, the photoresist film having a thickness of 50 μm or thicker and made of material having a transitivity of 90% or higher relative to an ultraviolet ray having a wavelength of 436 nm when the photoresist film has a thickness of 200 μm;

forming an opening through the photoresist film in an area corresponding to the pad to expose a partial surface area of the base conductive film;

depositing a conductive bump electrode on the base conductive film exposed on a bottom of the opening;

removing the photoresist film; and improving a hydrophilic property of a surface of the photoresist film, after said opening forming step, wherein said bump electrode depositing step deposits the bump electrode by plating a surface of the base conductive film exposed on the bottom of the opening.

5. A method of manufacturing a semiconductor device according to claim 4, wherein said hydrophilic property improving step ashes the surface of the photoresist film by oxygen plasma.

6. A method of manufacturing a semiconductor device comprising the steps of:

preparing a semiconductor substrate having a principal surface, an exposed pad made of conductive material being formed in a partial area of the principal surface, and the other area of the principal surface being covered with the first insulating film;

forming a base conductive film on the first insulating film and the pad;

forming a photoresist film on the base conducive film by coating photoresist source liquid having a viscosity of 3000 to 4000 cps on the base conductive film, the photoresist film having a thickness of 50 μm or thicker and made of material having a transitivity of 90% or higher relative to an ultraviolet ray having a wavelength of 436 nm when the photoresist film has a thickness of 200 μm;

forming an opening through the photoresist film in an area corresponding to the pad to expose a partial surface area of the base conductive film;

depositing a conductive bump electrode on the base conductive film exposed on a bottom of the opening;

removing the photoresist film; and improving a hydrophilic property of a surface of the photoresist film, after said opening forming step, wherein said bump electrode depositing step deposits the bump electrode by plating a surface of the base conductive film exposed on the bottom of the opening, wherein said hydrophilic property improving step immerses the semiconductor substrate into organic solvent.

7. A method of manufacturing a semiconductor device comprising the steps of:

preparing a semiconductor substrate having a principal surface, an exposed pad made of conductive material being formed in a partial area of the principal surface, and the other area of the principal surface being covered with the first insulating film;

forming a base conductive film on the first insulating film and the pad;

forming a photoresist film on the base conducive film by coating photoresist source liquid having a viscosity of 3000 to 4000 cps on the base conductive film, the photoresist film having a thickness of 50 μm or thicker and made of material having a transitivity of 90% or higher relative to an ultraviolet ray having a wavelength of 436 nm when the photoresist film has a thickness of 200 μm;

forming an opening through the photoresist film in an area corresponding to the pad to expose a partial surface area of the base conductive film;

depositing a conductive bump electrode on the base conductive film exposed on a bottom of the opening; and removing the photoresist film, wherein said bump electrode depositing step immerses the semiconductor substrate into plating liquid under a low pressure atmosphere to plate a surface of the base conductive film exposed on the bottom of the opening.

8. A method of manufacturing a semiconductor device comprising the steps of:

preparing a semiconductor substrate having a principal surface, an exposed pad made of conductive material being formed in a partial area of the principal surface, and the other area of the principal surface being covered with the first insulating film;

forming a base conductive film on the first insulating film and the pad;

forming a photoresist film on the base conducive film by coating photoresist source liquid having a viscosity of 3000 to 4000 cps on the base conductive film, the photoresist film having a thickness of 50 μm or thicker and made of material having a transitivity of 90% or higher relative to an ultraviolet ray having a wavelength of 436 nm when the photoresist film has a thickness of 200 μm;

forming an opening through the photoresist film in an area corresponding to the pad to expose a partial surface area of the base conductive film;

depositing a conductive bump electrode on the base conductive film exposed on a bottom of the opening; and removing the photoresist film, wherein said photoresist removing step removes the photoresist film by immersing the semiconductor substrate into resist removing liquid while the resist removing liquid is stirred.

9. A method of manufacturing a semiconductor device according to claim 1, wherein said bump electrode depositing step deposits a bump lower part made of a first metal and deposits a bump upper part on the bump lower part, the bump upper part being made of a second metal having a lower melting point than the first metal or conductive resin.

10. A method of manufacturing a semiconductor device according to claim 1, wherein said bump electrode depositing step deposits a bump lower part made of a first metal and deposits a bump upper part on the bump lower part, the bump upper part being made of a second metal more difficult to be oxidized than the first metal.

11. A method of manufacturing a semiconductor device comprising the steps of:

preparing a semiconductor substrate having a principal surface, an exposed pad made of conductive material being formed in a partial area of the principal surface, and the other area of the principal surface being covered with a first insulating film;

forming a base conductive film on the first insulating film and the pad;

forming a photoresist film having a thickness of 50 μm or thicker on the base conductive film;

forming an opening through the photoresist film in an area corresponding to the pad to expose a partial surface area of the base conductive film;

immersing the semiconductor substrate into a first liquid in a low pressure atmosphere;

picking up the semiconductor substrate from the first liquid, immersing the semiconductor substrate in plating liquid, and plating a surface of the base conductive film exposed on the bottom of the opening to deposit a conductive bump electrode; and removing the photoresist film, wherein the first liquid does not adversely affect a plating process in said conductive bump electrode depositing step.

12. A method of manufacturing a semiconductor device comprising the steps of:

preparing a semiconductor substrate having a principal surface, an exposed pad made of conductive material being formed in a partial area of the principal surface, and the other area of the principal surface being covered with a first insulating film;

forming a base conductive film on the first insulating film and the pad;

forming a photoresist film on the base conductive film;

forming an opening through the photoresist film in an area corresponding to the pad to expose a partial surface area of the base conductive film;

immersing the semiconductor substrate into electrolysis plating liquid and depositing a conductive bump electrode by electrolysis-plating a surface of the base conductive film exposed on the bottom of the opening while a current density is increased more the greater a height of the deposited bump electrode becomes; and removing the photoresist film.

13. A method of manufacturing a semiconductor device comprising the steps of:

preparing a semiconductor substrate having a principal surface, an exposed pad made of conductive material being formed in a partial area of the principal surface, and the other area of the principal surface being covered with a first insulating film;

forming a base conductive film on the first insulating film and the pad;

forming a photoresist film on the base conductive film;

selectively exposing and developing the photoresist film to form an opening through the photoresist film in an area corresponding to the pad to expose a partial surface of the base conductive film, said opening forming step repetitively executing a first subsidiary step and a second subsidiary step during developing the photoresist film, said first subsidiary step developing the photoresist film by applying developing liquid to the photoresist film while the semiconductor substrate is rotated, and said second subsidiary step removing thereafter photoresist swelled by the developing liquid by rotating the semiconductor substrate at a higher speed;

depositing a conductive bump electrode on the partial surface of the base conductive dump exposed on a bottom of the opening; and removing the photoresist film.

14. A method of manufacturing a semiconductor device according to claim 13, wherein a rotation number of the semiconductor substrate during said second subsidiary step is increased more than a rotation number during a preceding one of said second subsidiary step.

15. A method of manufacturing a semiconductor device according to claim 13, wherein a rotation number of the semiconductor substrate during said second subsidiary step is a twofold or more than a rotation number during said first subsidiary step.

16. A method of manufacturing a semiconductor device comprising the steps of:

preparing a semiconductor substrate having a principal surface, an exposed pad made of conductive material being formed in a partial area of the principal surface, and the other area of the principal surface being covered with a first insulating film;

forming a base conductive film on the first insulating film and the pad;

forming a photoresist film on the base conductive film;

selectively exposing and developing the photoresist film to form an opening through the photoresist film in an area corresponding to the pad to expose a partial surface of the base conductive film, said opening forming step repetitively executing a first subsidiary step and a second subsidiary step during developing the photoresist film, said first subsidiary step developing the photoresist film by applying developing liquid to the photoresist film while the semiconductor substrate is rotated, and said second subsidiary step removing thereafter photoresist swelled by the developing liquid by blowing gas toward the semiconductor substrate;

depositing a conductive bump electrode on the partial surface of the base conductive dump exposed on a bottom of the opening; and removing the photoresist film.

17. A method of manufacturing a semiconductor device comprising the steps of:

preparing a semiconductor substrate having a principal surface, an exposed pad made of conductive material being formed in a partial area of the principal surface, and the other area of the principal surface being covered with a first insulating film;

forming a base conductive film on the first insulating film and the pad;

forming a photoresist film on the base conductive film;

selectively exposing and developing the photoresist film to form an opening through the photoresist film in an area corresponding to the pad to expose a partial surface of the base conductive film, said opening forming step develops the photosensitive film by immersing the semiconductor substrate into developing liquid while the developing liquid is stirred;

depositing a conductive bump electrode on the partial surface of the base conductive dump exposed on a bottom of the opening; and removing the photoresist film.

18. A method of manufacturing a semiconductor device comprising the steps of:

preparing a semiconductor substrate having a principal surface, an exposed pad made of conductive material being formed in a partial area of the principal surface, and the other area of the principal surface being covered with a first insulating film;

forming a base conductive film on the first insulating film and the pad;

forming a first photoresist film on the base conductive film;

selectively exposing and developing the first photoresist film to form a first opening through the first photoresist film in an area extending from an area corresponding to the pad to an area in the semiconductor substrate where a conductive bump electrode is to be formed;

plating a conductive material on a partial surface area of the base conductive film exposed on a bottom of the first opening to form an interconnect;

removing the first photoresist film and forming a second photoresist film having a thickness of 50 μm or thicker on the base conductive film and the interconnect;

selectively exposing and developing the second photoresist film to form a second opening through the second photoresist film in an area where the conductive bump electrode is to be formed;

depositing the conductive bump electrode on a partial surface area of the interconnect exposed on a bottom of the second opening; and removing the second photoresist film.

19. A method of manufacturing a semiconductor device comprising the steps of:

preparing a semiconductor substrate having a principal surface, an exposed pad made of conductive material being formed in a partial area of the principal surface, and the other area of the principal surface being covered with a first insulating film;

forming a base conductive film on the first insulating film and the pad;

forming a first photoresist film on the base conductive film; selectively exposing and developing the first photoresist film to form a first opening through the first photoresist film in an area extending from an area corresponding to the pad to an area in the semiconductor substrate where a conductive bump electrode is to be formed;

plating a conductive material on a partial surface area of the base conductive film exposed on a bottom of the first opening to form an interconnect;

removing the first photoresist film and forming a second photoresist film having a thickness of 50 μm or thicker on the base conductive film and the interconnect;

selectively exposing and developing the second photoresist film to form a second opening through the second photoresist film in an area where the conductive bump electrode is to be formed;

depositing the conductive bump electrode on a partial surface area of the interconnect exposed on a bottom of the second opening; and removing the second photoresist film, wherein said bump electrode depositing step deposits the bump electrode so that an upper surface of the bump electrode is lower than an upper surface of the photoresist film.

20. A method of manufacturing a semiconductor device according to claim 18, wherein said second photoresist film forming step forms the second photoresist film by coating photoresist source liquid having a viscosity of 3000 to 4000 cps on a whole surface of the semiconductor substrate, the second photoresist film being made of a material having a transmittivity of 90% or higher relative to an ultraviolet ray having a wavelength of 436 nm when the second photoresist film has a thickness of 200 μm.

21. A method of manufacturing a semiconductor device according to claim 18, wherein said bump electrode depositing step deposits a bump lower part made of a first metal and deposits a bump upper part on the bump lower part, the bump upper part being made of a second metal having a lower melting point than the first metal.

22. A method of manufacturing a semiconductor device according to claim 18, wherein said bump electrode depositing step deposits a bump lower part made of a first metal and deposits a bump upper part on the bump lower part, the bump upper part being made of a second metal more difficult to be oxidized than the first metal.

23. A method of manufacturing a semiconductor device comprising the steps of:

preparing a semiconductor substrate having a principal surface, an exposed pad made of conductive material being formed in a partial area of the principal surface, and the other area of the principal surface being covered with a first insulating film;

forming a base conductive film on the first insulating film and the pad;

forming a first photoresist film on the base conductive film;

selectively exposing and developing the first photoresist film to forming a first opening through the first photoresist film in an area extending from an area corresponding to the pad to an are in the semiconductor substrate where a conductive bump electrode is to be formed;

plating a conductive material on a partial surface area of the base conductive film exposed on a bottom of the first opening to form an interconnect;

removing the first photoresist film and forming a second photoresist film having a thickness of 50 µm or thicker on a base conductive film and the interconnect;

selectively exposing and developing the second photoresist film to form a second opening through the second photoresist film in an area where the conductive bump electrode is to be formed;

depositing the conductive bump electrode on a partial surface area of the interconnect exposed on a bottom of the second opening; and removing the second photoresist film, wherein said bump electrode depositing step deposits a bump lower part made of a first metal and deposits a bump upper part on the bump lower part, the bump upper part being made of second metal more difficult to be oxidized than the first metal, and wherein after the bump lower part is deposited and before the bump upper part is deposited, said bump electrode depositing step deposits a bump intermediate part made of a third metal having a higher solder diffusion barrier performance than the bump upper part.

24. A method of manufacturing a semiconductor device according to claim 19, further comprising a step of removing a portion of the base conductive film not covered with the interconnect, after said second resist film removing step, and a step of forming a second insulating film covering a surface of the semiconductor substrate not formed with the bump electrode, the second insulating film being in contact with at least a partial area of the bump electrode excepting a head portion thereof.

25. A method of manufacturing a semiconductor device comprising the steps of:

preparing a semiconductor substrate having a principal surface, an exposed pad made of conductive material being formed in a partial area of the principal surface, and the other area of the principal surface being covered with a first insulating film;

forming a base conductive film on the first insulating film and the pad;

forming a first photoresist film on the base conductive film;

selectively exposing and developing the first photoresist film to form a first opening through the first photoresist film in an area extending from an area corresponding to the pad to an area in the semiconductor substrate where a conductive bump electrode and a probe pad are to be formed;

plating a conductive material on a partial surface area of the base conductive film exposed on a bottom of the first opening to form an interconnect;

removing the first photoresist film and removing a portion of the base conductive film not covered with the interconnect;

forming a second insulating film on a surface of the semiconductor substrate, the second insulating film covering the interconnect and having second and third openings in an area where the conductive bump electrode and the probe pad are to be formed;

depositing another base conductive film covering a surface of the second insulating film and inner surfaces of the second and third openings;

forming a second photoresist film on the other base conductive film;

selectively exposing and developing the second photoresist film to form a fourth opening in an area corresponding to the second opening;

depositing the conductive bump electrode on a partial surface of the other base conductive film exposed on a bottom of the fourth opening;

removing the second photoresist film; and removing a portion of the other base conductive film not covered with the conductive bump electrode to expose a partial surface area of the interconnect on a bottom of the third opening corresponding to the area where the probe pad is formed.

26. A method of manufacturing a semiconductor device according to claim 25, wherein said second photoresist film forming step forms the second photoresist film having a thickness of 50 µm or thicker.

27. A method of manufacturing a semiconductor device according to claim 25, wherein:

said interconnect forming step deposits through plating Cu on the partial surface area of the base conductive film exposed on the bottom of the first opening, and thereafter deposits through plating one metal selected from a group consisting of Pd, Ni, Au, and alloy thereof;

said bump electrode depositing step deposits the bump electrode made of alloy containing Pb and Sn; and after said other base conductive film removing step, the semiconductor substrate is heated to make the bump electrode have generally a sphere shape.

28. A semiconductor device comprising:

a semiconductor substrate having a principal surface;

a pad made of conductive material and formed on a partial area of the principal surface of said semiconductor substrate;

a first insulating film covering a partial area of the principal surface of said semiconductor substrate not covered with said pad;

an interconnect formed on the principal surface of said semiconductor substrate and electrically connected to said pad;

a bump electrode formed on a partial surface area of the interconnect different from an area where said interconnect is connected to the pad;

a second insulating film formed covering said interconnect; and an opening formed through said second insulating film, a bottom of said opening exposing a partial area of a surface of said interconnect corresponding to an area where said pad and said bump electrode are not formed.

29. A semiconductor device according to claim 28, wherein said interconnect has a multi-layer structure having a highest layer made of one metal selected from a group consisting of Pd, Ni, Au, and alloy thereof, and said bump electrode is made of SnPb alloy.

\* \* \* \* \*